(12) United States Patent
Ishikawa et al.

(10) Patent No.: US 7,828,193 B2
(45) Date of Patent: Nov. 9, 2010

(54) METHOD OF MOUNTING AN ELECTRONIC COMPONENT AND MOUNTING APPARATUS

(75) Inventors: Kuniko Ishikawa, Kawasaki (JP); Norio Kainuma, Kawasaki (JP); Hidehiko Kira, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 30 days.

(21) Appl. No.: 12/000,675

(22) Filed: Dec. 14, 2007

(65) Prior Publication Data

US 2008/0203138 A1 Aug. 28, 2008

(30) Foreign Application Priority Data

Feb. 28, 2007 (JP) .............................. 2007-050675

(51) Int. Cl.
*B23K 31/02* (2006.01)
(52) U.S. Cl. .............................. 228/110.1; 228/180.22; 228/207; 228/223
(58) Field of Classification Search ........................ None
See application file for complete search history.

(56) References Cited

U.S. PATENT DOCUMENTS

| | | | | | |
|---|---|---|---|---|---|
| 5,409,155 | A | * | 4/1995 | Chen ........................... | 228/6.2 |
| 5,427,301 | A | * | 6/1995 | Pham et al. .............. | 228/110.1 |
| 5,603,444 | A | * | 2/1997 | Sato ............................ | 228/1.1 |
| 5,655,700 | A | * | 8/1997 | Pham et al. ................. | 228/106 |
| 5,730,832 | A | * | 3/1998 | Sato et al. ..................... | 156/499 |
| 5,884,831 | A | * | 3/1999 | Sato et al. ..................... | 228/6.2 |
| 5,992,729 | A | * | 11/1999 | Koopman et al. ............ | 228/175 |
| 6,053,395 | A | * | 4/2000 | Sasaki .................... | 228/180.22 |
| 6,202,915 | B1 | * | 3/2001 | Sato ......................... | 228/110.1 |
| 6,798,072 | B2 | * | 9/2004 | Kajiwara et al. ............. | 257/778 |
| 7,154,206 | B2 | * | 12/2006 | Shimada et al. .......... | 310/313 R |
| 7,367,486 | B2 | * | 5/2008 | Kostiew .................... | 228/110.1 |
| 2005/0001014 | A1 | | 1/2005 | Takeuchi et al. | |
| 2005/0098610 | A1 | * | 5/2005 | Onobori et al. ......... | 228/180.21 |
| 2006/0091184 | A1 | * | 5/2006 | Bayot et al. .............. | 228/110.1 |

FOREIGN PATENT DOCUMENTS

| JP | 362217638 | A | * | 9/1987 |
|---|---|---|---|---|
| JP | 07-115109 | | | 5/1995 |
| JP | 411163199 | A | * | 6/1999 |
| JP | 2000-174059 | | | 6/2000 |
| JP | 2005-026579 | | | 1/2005 |
| JP | 2005-209833 | | | 8/2005 |

* cited by examiner

*Primary Examiner*—Kiley Stoner
(74) *Attorney, Agent, or Firm*—Staas & Halsey LLP

(57) ABSTRACT

In a method of mounting an electronic component on a substrate, electrode terminals on at least one of the substrate and the electronic component are composed of solder bumps. The electrode terminals of the substrate and the electrode terminals of the electronic component are placed in contact and ultrasonic vibration is applied to at least one of the substrate and the electronic component to provisionally bond the electrode terminals together. A gap between the substrate and the electronic component is then filled with flux fill, and the electrode terminals of the substrate and the electronic component are bonded by reflowing the solder bumps.

7 Claims, 5 Drawing Sheets

US 7,828,193 B2

METHOD OF MOUNTING AN ELECTRONIC COMPONENT AND MOUNTING APPARATUS

BACKGROUND OF THE INVENTION

1. Field of the Invention

The present invention relates to a method of mounting an electronic component on a substrate by bonding together electrode terminals of the substrate and the electronic component, wherein the electrode terminals of at least one of the substrate and the electronic component are composed of solder bumps, and to a mounting apparatus.

2. Related Art

Techniques where a semiconductor chip is flip-chip bonded to a substrate by bonding solder bumps, as the electrode terminals of a semiconductor chip as an electronic component, to pads, as the electrode terminals of the substrate, are in conventional use.

A typical method will now be described with reference to FIGS. 5A to 5F. Note that in FIGS. 5A to 5F, only one pair out of the large number of electrode terminals formed on the semiconductor chip and on the substrate are shown.

FIG. 5A shows a substrate 12 on which a semiconductor chip 10 will be mounted. Reference numeral 14 designates a pad as an electrode terminal formed on the surface of the substrate 12, and reference numeral 16 designates a solder resist that covers the surface of the substrate 12. FIG. 5B shows a state where flux 18 has been expelled from a nozzle so that the surface of the pad 14 is covered by the flux 18. FIG. 5C shows a state where a solder bump 20 as an electrode terminal of the semiconductor chip 10 has been aligned with the pad 14 and the semiconductor chip 10 has been provisionally fixed to the substrate 12 using the viscosity of the flux 18.

FIG. 5D shows a state where the semiconductor chip 10 has been bonded to the substrate 12 by reflowing the solder bump 20. When the solder is reflowed, an oxide film is removed due to the activating effect of the flux 18, so that the solder bump 20 is tightly bonded to the pad 14. FIG. 5E shows a state where the flux 18 remaining in the periphery of the pad 14 has been removed by washing. The flux 18 includes a component that corrodes the electrode and the like. Accordingly, it is necessary to remove the flux 18 remaining on the substrate 12 by washing. FIG. 5F shows a state where the gap between the substrate 12 and the semiconductor chip 10 has been filled with underfill resin 22 to finally mount the semiconductor chip 10 on the substrate 12.

With the conventional method shown in FIGS. 5A to 5F, the flux 18 is applied so as to improve the bonding of the solder bump 20 and the pad 14 by reducing a film of oxidized solder formed on the outer surface of the solder bump 20.

With the conventional method described above, it is necessary to wash away the flux, which leads to increased complexity and cost for the manufacturing process. For this reason, Patent Document 1 discloses a method for removing the oxidized solder film on the surface of the solder bump without using flux. In a state where the solder bumps of the semiconductor chip contact the pads of the substrate, ultrasonic vibration is applied to the semiconductor chip before the solder bumps are reflowed to cause the solder bumps to rub against the pads and thereby remove the oxidized solder film on the surface of the solder bumps. By doing so, it is possible to improve the bonding between the solder bumps and the pads after reflowing (see Paragraph 0011 of Patent Document 1).

Patent Document 2 also discloses a technique where ultrasonic vibration is applied to remove an oxide film on the solder bumps and an oxide film on the metal pads (see Paragraph 0019 of Patent Document 2). Patent Document 2 discloses that the atmosphere used during flip-chip bonding is the normal atmosphere, an inert atmosphere such as nitrogen or argon, or a reducing atmosphere such as carbon dioxide gas or hydrogen (see Paragraph 0023 of Patent Document 2).

The technique disclosed in Patent Document 3 is another conventional method where it is not necessary to wash away flux. The technique disclosed in Patent Document 3 will now be described with reference to FIGS. 6A to 6C.

FIG. 6A shows a state where flux fill 30 has been expelled from a nozzle 26 onto a surface of the substrate 12 on which the pads 14 are formed so that regions where the pads 14 are formed are covered with the flux fill 30. FIG. 6B shows a state where the solder bumps 20 are pressed against and bonded to the pads 14 while applying ultrasonic vibration to the semiconductor chip 10. If the solder bumps 20 are pressed against the pads 14 while applying ultrasonic vibration to the semiconductor chip 10, the filler inside the flux fill 30 will be pressed away from the surfaces of the pads 14 by the solder bumps 20, so that the solder bumps 20 will come into contact with the pads 14. Since the flux fill 30 acts as flux, an oxidized film that covers the pads and the like is removed by the energy of the ultrasonic vibration, and it is possible to bond the solder bumps 20 to the pads 14 using only the energy of the ultrasonic vibration (see Paragraphs 0014, 0015 of Patent Document 3).

FIG. 6C shows a state where the solder bumps 20 have been bonded to the pads 14 to mount the semiconductor chip 10 on the substrate 12. The solder bumps 20 are bonded to the pads 14 and the gap between the semiconductor chip 10 and the substrate 12 is underfilled with the flux fill 30 (see Paragraph 0016 of Patent Document 3).

Patent Document 1
  Japanese Laid-Open Patent Publication No. 2000-174059 (Paragraph 0011)

Patent Document 2
  Japanese Laid-Open Patent Publication No. 7-115109 (Paragraphs 0019, 0023)

Patent Document 3
  Japanese Laid-Open Patent Publication No. 2005-26579 (Paragraphs 0014 to 0016, FIG. 1)

SUMMARY OF THE INVENTION

The techniques disclosed in Patent Documents 1 to 3 have the following problems.

Patent Document 1 discloses that ultrasonic vibration is applied to the semiconductor chip to cause the solder bumps to rub against the pads and thereby remove a film of oxidized solder on the surface of the solder bumps.

However, the inventor of the present application has found that if ultrasonic vibration is applied to the semiconductor chip to cause the solder bumps to rub against the pads, the oxide film on the solder bumps conversely increases.

It is believed that this occurs for the following reason. When a newly-formed surface of a solder bump becomes exposed due to the friction caused by the ultrasonic vibration, such newly-formed surface quickly oxidizes due to the oxygen in the atmosphere, and as the ultrasonic vibration continues, exposed newly-formed surfaces become further oxidized. Due to this phenomenon (fretting corrosion) repeatedly occurring while the ultrasonic vibration is applied, the oxide film on the solder bumps rapidly increases.

Patent Document 2 discloses that a bonding process where ultrasonic vibration is applied is carried out in an inert gas atmosphere. Conventionally, to produce an inert gas atmosphere, it is necessary to provide the entire mounting apparatus (or "bonder") used for flip-chip bonding inside a chamber and to further provide equipment and processes that fill the chamber with inert gas, resulting in unavoidable increases in the equipment cost and in the number of manufacturing processes.

In the technique disclosed in Patent Document 3, since the solder bumps 20 are placed in contact with the pads 14 as shown in FIG. 6B in a state where the flux fill 30 has been applied onto the pads (electrodes) 14 of the substrate 12 as shown in FIG. 6A, the liquid component of the flux fill 30 will remain between the pads 14 and the solder bumps 20 and may adversely affect the bonding between the pads 14 and the solder bumps 20.

Note that due to manufacturing circumstances, the pads 14 are sometimes formed so as to be concave in the center as shown in FIG. 7. In particular, when the centers of the pads 14 are concave in form, with the technique disclosed in Patent Document 3, the flux fill 30 will remain in the concaves, which may adversely affect the bonds between the pads 14 and the solder bumps 20.

The present invention was conceived to solve the problems described above and it is an object of the present invention to provide a method of mounting and a mounting apparatus for an electronic component that do not increase the oxide film on solder bumps or can favorably remove an increased oxide film when applying ultrasonic vibration to provisionally bond electrode terminals before the solder bumps are reflowed, that can also suppress increases in equipment cost and the number of manufacturing processes, and that prevent the effects of flux fill from causing deterioration in the bonding between pads and the solder bumps.

To achieve the stated object, a method of mounting an electronic component according to the present invention includes steps of: placing electrode terminals of a substrate and electrode terminals of an electronic component in contact and applying ultrasonic vibration to at least one of the substrate and the electronic component to provisionally bond the electrode terminals together, wherein the electrode terminals of at least one of the substrate and the electronic component are composed of solder bumps; filling a gap between the substrate and the electronic component with flux fill; and bonding the electrode terminals of the substrate and the electronic component together by reflowing the solder bumps.

By doing so, since the gap between the substrate and the electronic component is filled with flux fill after the ultrasonic vibration has been applied to provisionally bond the electrode terminals, there is no deterioration in the bonding between the pads and the solder bumps due to the effects of the flux fill as in the conventional art (Patent Document 3). In addition, by then reflowing the solder bumps, an oxide film produced by fretting corrosion due to the ultrasonic vibration will come into contact with and be reduced by a reducing component included in the flux fill, thereby making it possible to maintain favorable bonding. It is also unnecessary to prepare equipment such as a chamber and to add extra processes for producing an inert gas atmosphere.

In addition, the electrode terminals of one of the substrate and the electronic component may be solder bumps and the electrode terminals of the other of the substrate and the electronic component may be pads with a surface layer made of solder.

With this construction, when ultrasonic vibration is applied, soft solder will rub against soft solder, which reduces the frictional force and makes it possible to suppress the occurrence of fretting corrosion.

Another method of mounting an electronic component according to the present invention includes steps of: placing electrode terminals of a substrate and electrode terminals of an electronic component in contact and applying ultrasonic vibration to at least one of the substrate and the electronic component while inert gas is blown between the substrate and the electronic component to provisionally bond the electrode terminals together, wherein the electrode terminals of at least one of the substrate and the electronic component are composed of solder bumps; and bonding the electrode terminals of the substrate and the electronic component together by reflowing the solder bumps.

By doing so, since inert gas is blown between the substrate and the semiconductor chip to produce a localized inert gas atmosphere at the electrode terminals, large scale equipment such as a chamber and extensive processes are not required, so that it is possible to suppress the equipment cost and the number of processes required to produce the inert gas atmosphere. There is also no deterioration in the bonding between the pads and the solder bumps due to the effects of the flux fill as in the conventional art (Patent Document 3).

In addition, inert gas that is heated to a substantially equal temperature as a heating temperature of the substrate and the electronic component may be blown between the substrate and the electronic component.

By doing so, it is possible to keep the amounts of thermal expansion of the substrate and the electronic component constant.

The inert gas may be blown between the substrate and the electronic component from a plurality of positions around the electronic component.

The substrate and the electronic component may be surrounded by a surrounding wall so that the inert gas does not disperse.

By doing so, the concentration of the inert gas between the substrate and the electronic component can be increased.

In addition, the electrode terminals of one of the substrate and the electronic component may be solder bumps and the electrode terminals of the other of the substrate and the electronic component may be pads with a surface layer made of solder.

With this construction, when ultrasonic vibration is applied, soft solder will rub against soft solder, which reduces the frictional force and makes it possible to suppress the occurrence of fretting corrosion.

A mounting apparatus for an electronic component according to the present invention is also constructed to achieve the stated object and includes: a stage on which a substrate is placed; an electronic component conveying means that conveys an electronic component onto the substrate placed on the stage to place electrode terminals of the substrate and electrode terminals of the electronic component in contact; a blower that blows inert gas between the substrate placed on the stage and the electronic component conveyed onto the substrate; and ultrasonic vibration applying means that applies ultrasonic vibration to at least one of the substrate placed on the stage and the electronic component conveyed onto the substrate.

With this construction, since inert gas is blown between the substrate and the semiconductor chip by a blower to produce a localized inert gas atmosphere at the electrode terminals, large scale equipment such as a chamber and extensive processes are not required, so that it is possible to suppress the equipment cost and the number of processes required to produce the inert gas atmosphere. There is also no deterioration in the bonding between the pads and the solder bumps due to the effects of the flux fill as in the conventional art (Patent Document 3).

The mounting apparatus may further include gas heating means for heating the inert gas.

With this construction, by using the gas heating means, it is possible to keep the temperature of the inert gas substantially equal to the heating temperature of the substrate and the electronic component, so that the amounts of thermal expansion of the substrate and the electronic component can be kept constant.

The blower may have a plurality of supply openings for the inert gas that are disposed so as to blow inert gas between the substrate and the electronic component from a plurality of positions around the electronic component while the ultrasonic vibration is being applied.

The mounting apparatus may further include a surrounding wall that surrounds the substrate and the electronic component to prevent the inert gas from dispersing.

By doing so, the concentration of the inert gas between the substrate and the electronic component can be increased.

The mounting apparatus may further include a bonding head that contacts an opposite surface of the electronic component to the surface on which the electrode terminals are formed, wherein the ultrasonic vibration applying means may apply ultrasonic vibration to the bonding head so that the ultrasonic vibration is applied to the electronic component via the bonding head.

By doing so, the construction of the ultrasonic vibration applying means can be simplified.

The electronic component conveying means may hold the electronic component via the bonding head and move the bonding head to convey the electronic component onto the substrate.

By doing so, it is possible to construct the ultrasonic vibration applying means and the electronic component conveying means with a shared bonding head, so that the construction of the apparatus can be simplified.

According to the method of mounting and mounting apparatus for an electronic component according to the present invention, it is possible to avoid an increase in the oxide film on solder bumps or to favorably remove an increased oxide film when applying ultrasonic vibration to provisionally bond electrode terminals before the solder bumps are reflowed, and also possible to suppress increases in equipment cost and the number of manufacturing processes and to prevent the effects of the flux fill from causing deterioration in the bonding between the pads and the solder bumps.

DESCRIPTION OF THE PREFERRED EMBODIMENTS

Figure 1:
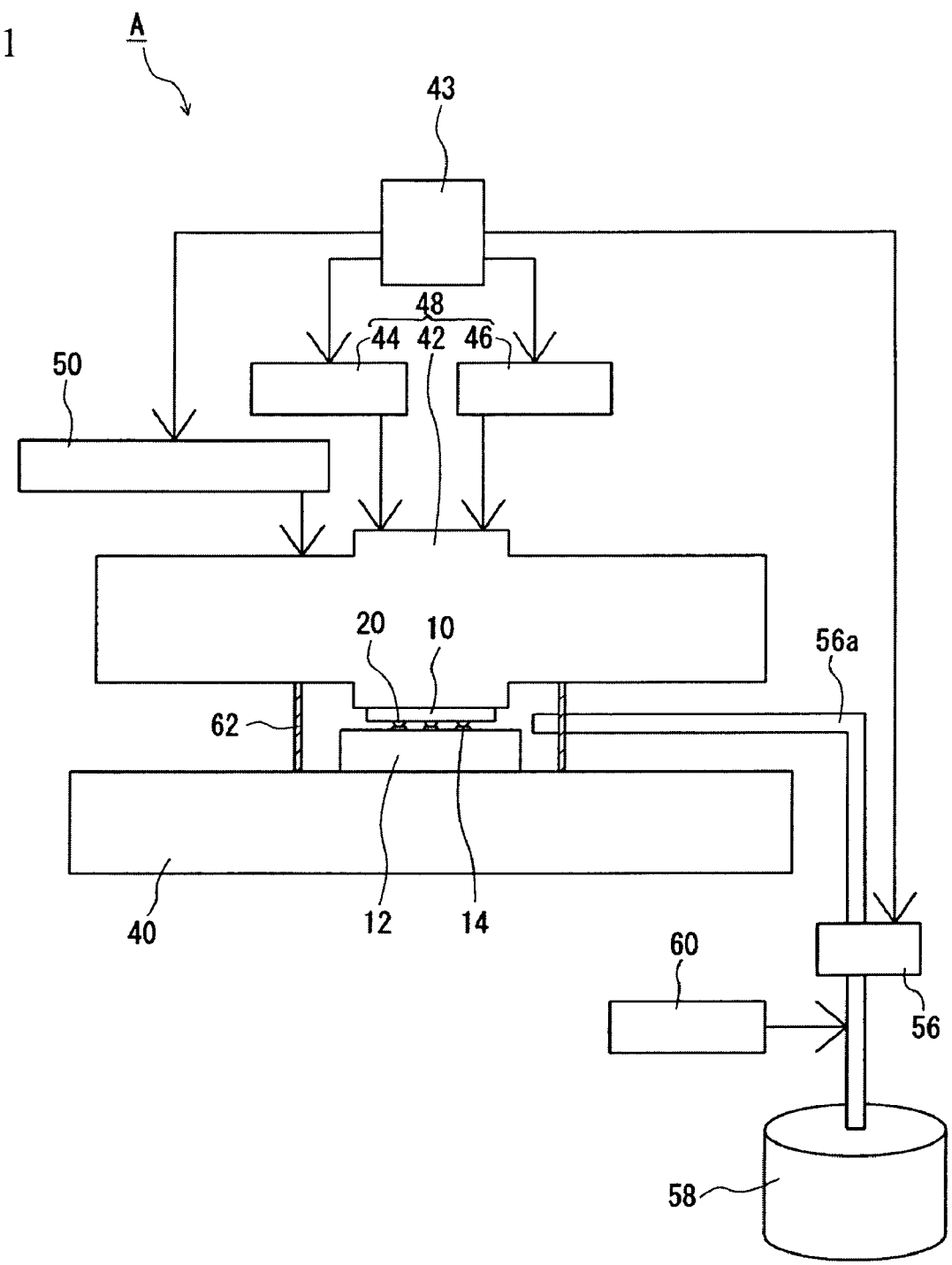
FIG. 1 is a schematic diagram showing a mounting apparatus for an electronic component (semiconductor chip) according to a first embodiment of the present invention.

Preferred embodiments of a method of mounting and a mounting apparatus for an electronic component according to the present invention will now be described with reference to the attached drawings. Note that members that are the same as those shown in FIGS. 5A to 6C have been assigned the same reference numerals and description thereof has been omitted.

FIG. 1 is a schematic diagram showing the construction of a mounting apparatus A for a semiconductor chip according to a first embodiment of a mounting apparatus for an electronic component.

As shown in FIG. 1, the mounting apparatus A for a semiconductor chip includes a stage 40 on which the substrate 12 is placed and a bonding head 42 that can hold the semiconductor chip 10 on a lower surface thereof using suction.

The mounting apparatus A for a semiconductor chip also includes an electronic component conveying means 48, an ultrasonic vibration applying means 50, a blower 56, and a surrounding wall 62. These components are described below.

Electronic Component Conveying Means 48

The electronic component conveying means 48 is composed of the bonding head 42, a driving device 44, and a suction device 46.

By sucking air from suction holes formed on a lower surface of the bonding head 42 using the suction device 46, the opposite surface of the semiconductor chip 10 to the surface on which the solder bumps 20 are formed is held by suction on the lower surface of the bonding head 42, thereby holding the semiconductor chip 10. The bonding head 42 is provided so as to be connected to the driving device 44 so as to be movable in the horizontal plane and the vertical direction.

The driving device 44 and the suction device 46 are driven and controlled by a control unit 43 (i.e., computer) to pick up a semiconductor chip 10 placed on a tray, not shown, with the bonding head 42 using suction, to convey the semiconductor chip 10 held by the bonding head 42 onto the substrate 12 placed on the stage 40, and place the electrode terminals (i.e., the pads 14 and the solder bumps 20) of the substrate 12 and the semiconductor chip 10 in contact with each other.

Ultrasonic Vibration Applying Means 50

The ultrasonic vibration applying means 50 applies ultrasonic vibration to the semiconductor chip 10 via the bonding head 42 by causing the bonding head 42 to vibrate ultrasonically.

The ultrasonic vibration applying means 50 includes an ultrasonic horn provided so that one end thereof contacts a side surface of the bonding head 42, an ultrasonic vibrator provided in contact with the other end of the ultrasonic horn, and an ultrasonic control unit that applies a current to the ultrasonic vibrator to cause ultrasonic vibration.

The ultrasonic control unit is connected to the control unit 43 and the timing and the like at which the ultrasonic vibration is applied is controlled by the control unit 43.

Note that for the present invention, the ultrasonic vibration applying means 50 is not limited to applying ultrasonic vibration to the electronic component (semiconductor chip), and it is possible to use a construction where ultrasonic vibration is applied to the substrate or a construction where ultrasonic vibration is applied to both the substrate and the electronic component.

Blower 56

The blower 56 blows nitrogen gas as an inert gas from a nozzle 56a into a gap between the substrate 12 placed on the stage 40 and the semiconductor chip 10 conveyed onto the substrate 12. The blower 56 draws the nitrogen gas from a nitrogen gas tank 58 and blows the nitrogen gas out from the nozzle 56a. The supply opening (i.e., front end) of the nozzle 56a of the blower 56 is provided so as to face the semiconductor chip 10 from an outer periphery of an outer edge of the semiconductor chip 10.

Note that although only one nozzle 56a is provided in FIG. 1, a plurality of nozzles 56a (supply openings) may be provided so that the nitrogen gas is blown out from a plurality of positions around the semiconductor chip 10.

Control over the blowing out and stopping of the nitrogen gas by the blower 56 is carried out by the control unit 43.

Note that for the present invention, the inert gas is not limited to nitrogen gas and argon gas, for example, may be used instead.

The mounting apparatus A for a semiconductor chip is also equipped with a heating means 60 for heating the nitrogen gas blown out from the blower 56.

Surrounding Wall 62

The mounting apparatus A for a semiconductor chip is further equipped with a cylindrical surrounding wall 62 so as to surround the outer circumference of the substrate 12 and the semiconductor chip 10 and prevent the nitrogen gas blown out from the nozzle 56a of the blower 56 from dispersing. Note that in FIG. 1, the surrounding wall 62 is shown by a cross-section that is parallel to the axis of the surrounding wall 62. A cutaway portion or an opening that avoids the nozzle 56a is provided in the surrounding wall 62. As examples, the surrounding wall 62 may be fixed to the stage 40 or may be provided on the lower surface of the bonding head 42.

Next, a method of mounting a semiconductor chip using the mounting apparatus A for a semiconductor chip shown in FIG. 1 will be described as a first embodiment of a method of mounting an electronic component.

Figure 2A:
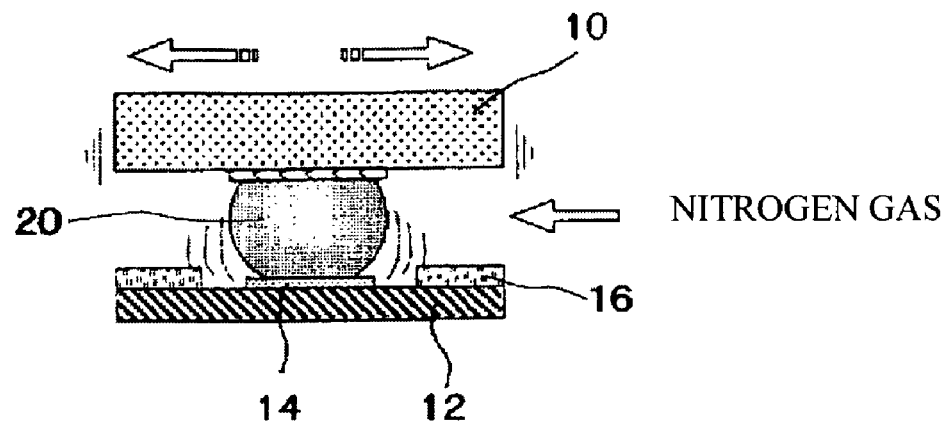
FIGS. 2A to 2C are schematic diagrams showing a method of mounting an electronic component (semiconductor chip) according to the first embodiment of the present invention.
Figure 2B:
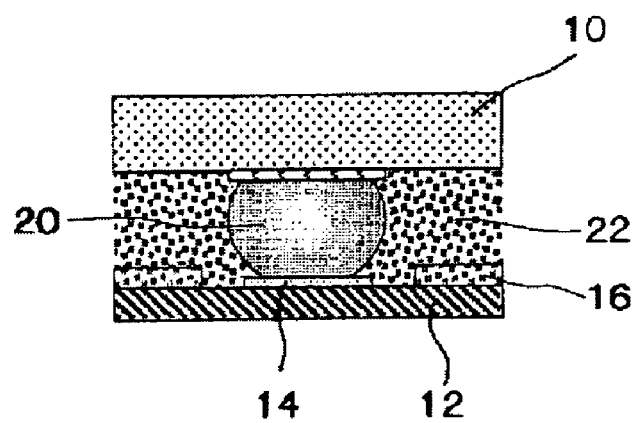
Figure 2C:
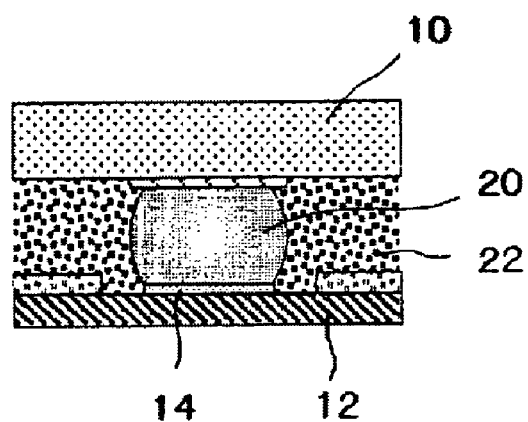

FIGS. 2A to 2C are schematic diagrams showing a method of mounting the semiconductor chip 10 as an electronic component on the substrate 12, and show an enlargement of a bond between a solder bump 20 as an electrode terminal of the semiconductor chip 10 and a pad 14 as an electrode terminal formed on the substrate 12.

First, the control unit 43 drives and controls the driving device 44 to move the bonding head 42 above a semiconductor chip 10 placed on a tray, not shown. Next, the control unit 43 controls the suction device 46 to have the semiconductor chip 10 held by suction on the lower surface of the bonding head 42. In addition, the control unit 43 drives and controls the driving device 44 to have the semiconductor chip 10 held by the bonding head 42 conveyed onto the substrate 12 placed on the stage 40 and have the electrode terminals (i.e., the pads 14 and the solder bumps 20) of the substrate 12 and the semiconductor chip 10 placed in contact as shown in FIG. 2A.

When doing so, as shown in FIG. 1, the surrounding wall 62 attached to the stage 40 or the bonding head 42 surrounds the outer circumference of the substrate 12 and the semiconductor chip 10.

Next, the control unit 43 controls the blower 56 to blow out nitrogen gas between the substrate 12 and the semiconductor chip 10. When doing so, the nitrogen gas is heated by the heating means 60 so that the temperature of the nitrogen gas between the substrate 12 and the semiconductor chip 10 reaches substantially the same temperature as the heating temperature (normally around 100° C.) of the substrate 12 and the semiconductor chip 10.

After this, in a state where the nitrogen gas is blown out between the substrate 12 and the semiconductor chip 10 by the blower 56, the control unit 43 drives and controls the ultrasonic vibration applying means 50 to apply the ultrasonic vibration to the semiconductor chip 10 via the bonding head 42 to provisionally bond the solder bumps 20 and the pads 14.

After stopping the application of the ultrasonic vibration, the control unit 43 carries out control to stop the blowing out of nitrogen gas by the blower 56.

This provisional bonding is carried out to prevent the pads 14 and the solder bumps 20 (i.e., the substrate 12 and the semiconductor chip 10) from becoming displaced before the solder bumps 20 and the pads 14 are finally bonded by the reflow process, described later.

Next, as shown in FIG. 2B, the gap between the substrate 12 and the semiconductor chip 10 is filled with the underfill resin 22.

After this, the control unit 43 drives and controls the driving device 44 to move the bonding head 42 above another tray, not shown, and controls the suction device 46 to stop the suction so that the semiconductor chip 10 is placed on the tray.

Next, the tray is conveyed into a reflow oven, the solder bumps 20 are reflowed by the reflow oven, and as shown in FIG. 2C, the solder bumps 20 are bonded to the pads 14 of the substrate 12.

According to the mounting apparatus A for a semiconductor chip and the method of mounting a semiconductor chip according to the first embodiment of the present invention, nitrogen gas is blown by the blower 56 between the substrate 12 and the semiconductor chip 10 to produce a localized nitrogen gas atmosphere at the electrode terminals, and therefore large scale equipment such as a chamber and extensive processes are not required as in the conventional art, so that it is possible to suppress the equipment cost and the number of processes required to produce the inert gas atmosphere. There is also no deterioration in the bonding between the pads and the solder bumps due to the effects of the flux fill as in the conventional art (Patent Document 3).

Since the temperature of the blown nitrogen gas is set at a temperature that is substantially equal to the heating temperature of the substrate 12 and the semiconductor chip 10, it is possible to keep the amounts of thermal expansion of the substrate 12 and the semiconductor chip 10 constant, and therefore problems such as fractures in the bonds between the electrode terminals due to differences in the rate of thermal expansion between the substrate 12 and the semiconductor chip 10 do not occur.

Since the nitrogen gas does not disperse due to the surrounding wall 62, the concentration of the nitrogen gas between the substrate 12 and the semiconductor chip 10 can be increased. Note that the surrounding wall 62 does not necessarily need to be provided.

In addition, by using a construction where a plurality of nozzles 56a (supply openings) are provided around the semiconductor chip 10 so that the nitrogen gas is blown out from a plurality of positions around the semiconductor chip 10, it is possible to increase the concentration of the nitrogen gas between the substrate 12 and the semiconductor chip 10.

Next, a method of mounting a semiconductor chip as a second embodiment of a method of mounting an electronic component according to the present invention will be described.

Figure 3A:
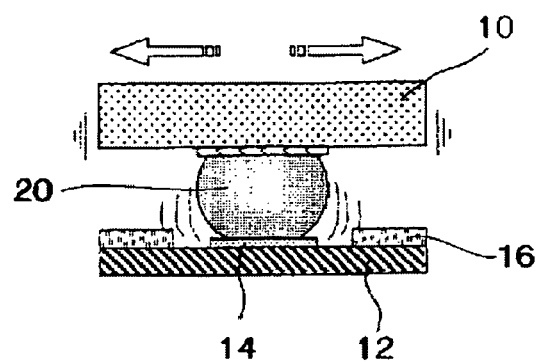
FIGS. 3A to 3C are schematic diagrams showing a method of mounting an electronic component (semiconductor chip) according to a second embodiment of the present invention.

First, as shown in FIG. 3A, the solder bumps 20 and the pads 14 are placed in contact and ultrasonic vibration is applied to the semiconductor chip 10 to provisionally bond the solder bumps 20 and the pads 14.

Aside from nitrogen gas not being blown out, this process is the same as the step shown in FIG. 2A of the first embodiment, and therefore detailed description thereof is omitted.

Figure 3B:
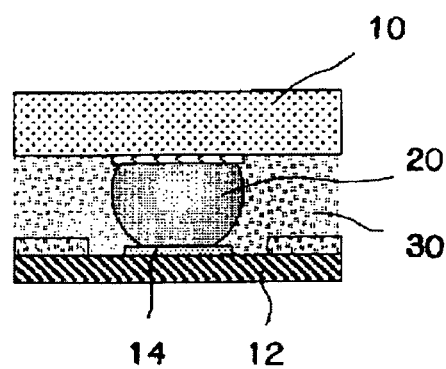

Next, as shown in FIG. 3B, the gap between the substrate 12 and the semiconductor chip 10 is filled with the flux fill 30.

Figure 3C:
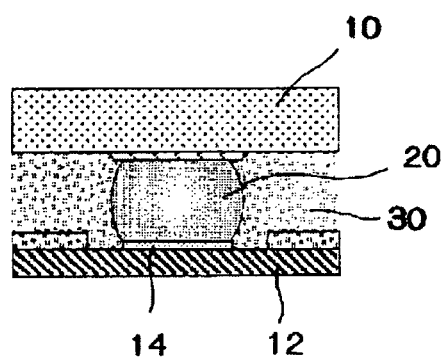

After this, as shown in FIG. 3C, by reflowing the solder bumps 20, the pads 14 of the substrate 12 and the solder bumps 20 are bonded. Since the method of reflowing is also the same as the reflowing process in the first embodiment, detailed description thereof is omitted.

According to the method of mounting a semiconductor chip according to the second embodiment, since the gap between the substrate 12 and the semiconductor chip 10 is filled with the flux fill 30 after the electrode terminals have already been provisionally bonded by applying the ultrasonic vibration, there is no deterioration in the bonding between the pads and the solder bumps due to the effects of the flux fill as in the conventional art (Patent Document 3). In addition, by reflowing the solder bumps 20, an oxide film produced by fretting corrosion due to the ultrasonic vibration will come into contact with and be reduced by a reducing component included in the flux fill 30, thereby making it possible to maintain favorable bonding. It is also unnecessary to prepare equipment and to add extra processes for producing an inert gas atmosphere.

Figure 4:
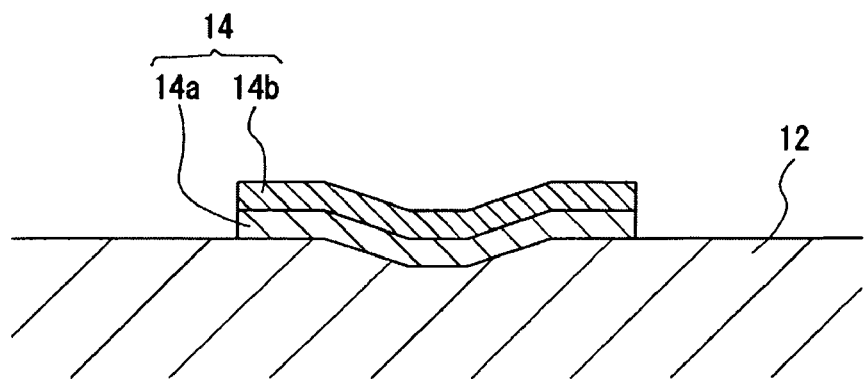
FIG. 4 is a schematic diagram showing one example construction of a pad (electrode terminal)
Figure 5A:
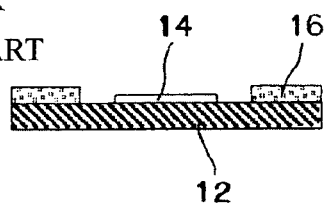
FIGS. 5A to 5F are diagrams showing a conventional method of mounting an electronic component.
Figure 5B:
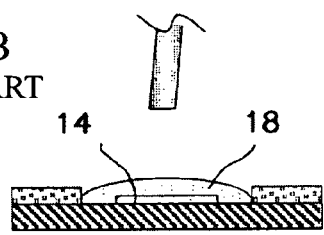
Figure 5C:
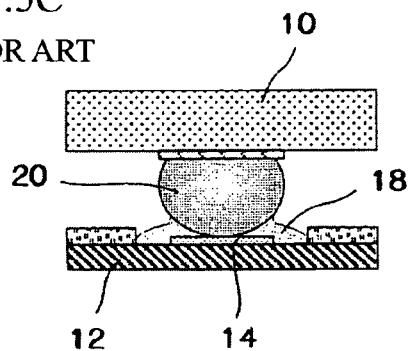
Figure 5D:
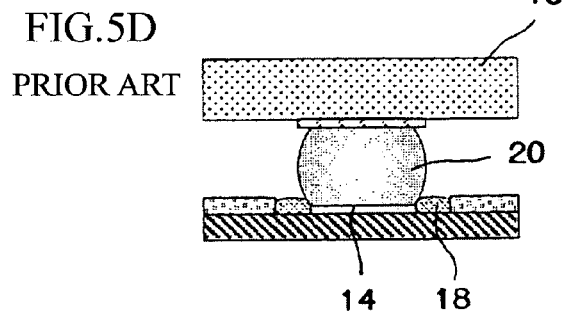
Figure 5E:
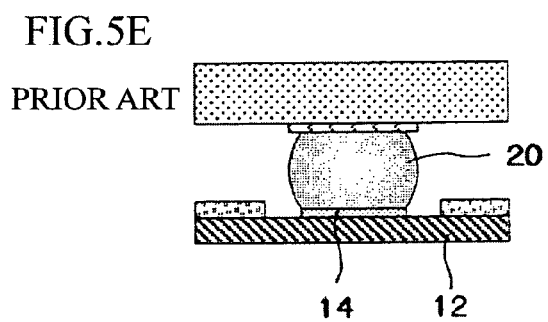
Figure 5F:
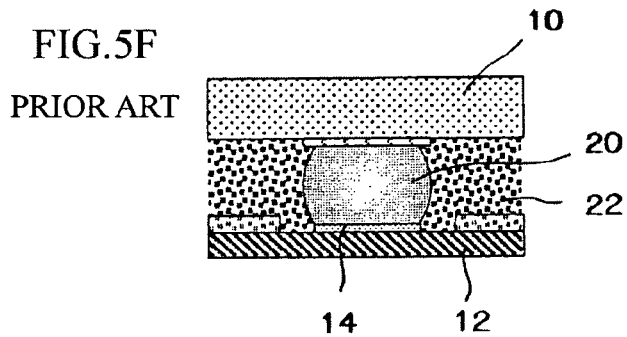
Figure 6A:
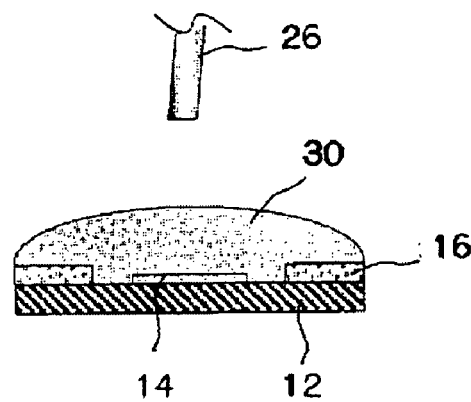
FIGS. 6A to 6C are diagrams showing a conventional method of mounting an electronic component.
Figure 6B:
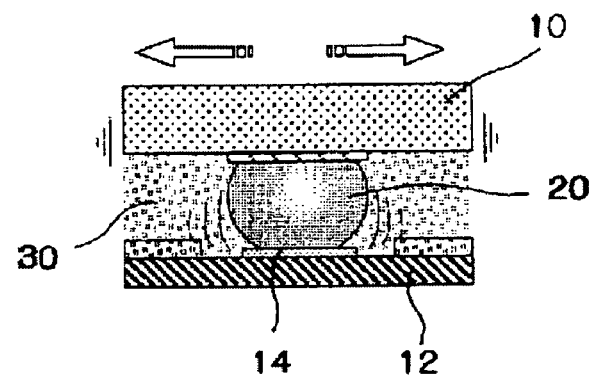
Figure 6C:
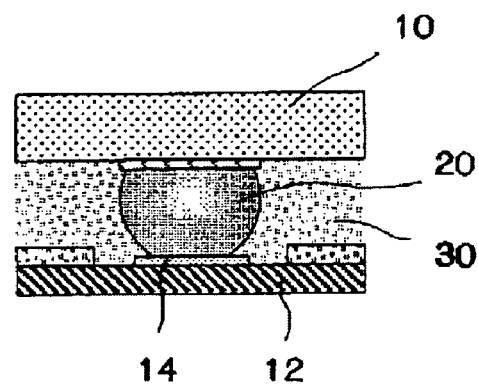
Figure 7:
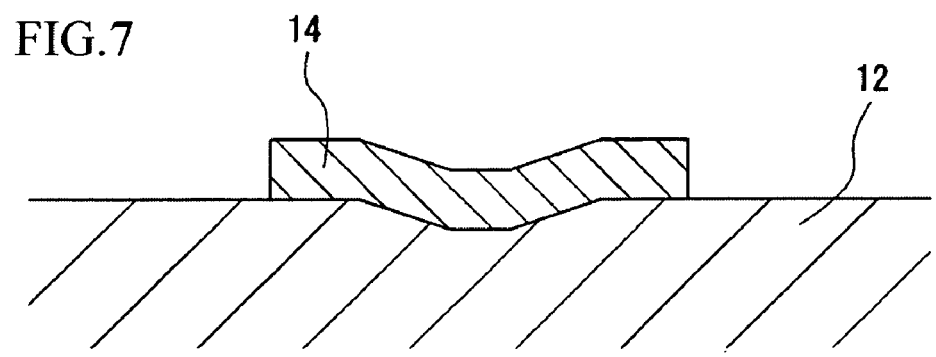
FIG. 7 is a diagram showing the shape of a pad (electrode terminal).

In the first and second embodiments, as shown in FIG. 4, the pads 14 can be favorably constructed of base portions 14a made of metal or the like and surface layers 14b made of solder. With this construction, when ultrasonic vibration is applied, the surface layers 14b of the pads 14 and the solder bumps 20, which are both made of soft solder, will rub together, which reduces the frictional force and makes it possible to suppress the occurrence of fretting corrosion.

What is claimed is:

1. A method of mounting an electronic component comprising:

placing electrode terminals of a substrate and electrode terminals of an electronic component in contact wherein the electrode terminals of at least one of the substrate and the electronic component are composed of solder bumps;

applying ultrasonic vibration to at least one of the substrate and the electronic component to provisionally bond the electrode terminals together;

filling a gap between the substrate and the electronic component with flux fill after provisionally bonding the electrode terminals together with the ultrasonic vibration; and bonding the electrode terminals of the substrate and the electronic component together by melting and reflowing the solder bumps and reducing oxide formed by the ultrasonic vibration.

2. A method of mounting an electronic component according to claim 1, wherein the electrode terminals of one of the substrate and the electronic component are solder bumps and the electrode terminals of the other of the substrate and the electronic component are pads with a surface layer made of solder.

3. A method of mounting an electronic component according to claim 1: wherein inert gas is blown between the substrate and the electronic component to provisionally bond the electrode terminals together when ultrasonic vibration is applied to at least one of the substrate and the electronic component to provisionally bond the electrode terminals and reduce oxidation.

4. A method of mounting an electronic component according to claim 3, wherein inert gas that is heated to a substantially equal temperature as a heating temperature of the substrate and the electronic component is blown between the substrate and the electronic component.

5. A method of mounting an electronic component according to claim 3, wherein the inert gas is blown between the substrate and the electronic component from a plurality of positions around the electronic component.

6. A method of mounting an electronic component according to claim 3, wherein the substrate and the electronic component are surrounded by a surrounding wall so that the inert gas does not disperse.

7. A method of mounting an electronic component according to claim 3, wherein the electrode terminals of one of the substrate and the electronic component are solder bumps and the electrode terminals of the other of the substrate and the electronic component are pads with a surface layer composed of solder.

* * * * *